United States Patent
Steiner et al.

(10) Patent No.: US 7,254,169 B1
(45) Date of Patent: Aug. 7, 2007

(54) METHOD AND APPARATUS FOR DETERMINING A LOSS OF SIGNAL CONDITION

(75) Inventors: Philip David Steiner, Montreal (CA); Michael H. Perrott, Cambridge, MA (US); Vadim Gutnik, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 924 days.

(21) Appl. No.: 10/015,030

(22) Filed: Dec. 11, 2001

Related U.S. Application Data

(60) Provisional application No. 60/302,912, filed on Jul. 3, 2001.

(51) Int. Cl.
*H04Q 1/20* (2006.01)
*H04L 7/00* (2006.01)
*H04B 17/00* (2006.01)
*H03F 1/26* (2006.01)
*H03F 3/45* (2006.01)

(52) U.S. Cl. .................. 375/227; 375/318; 375/344; 375/355; 455/67.13; 327/52; 702/193

(58) Field of Classification Search ........... 375/222, 375/227, 318, 340, 344, 345, 355, 224; 455/13.4, 455/67.11, 67.13; 327/20, 52; 702/107, 702/189, 193
See application file for complete search history.

(56) References Cited

U.S. PATENT DOCUMENTS

| | | | |
|---|---|---|---|
| 4,973,976 A | 11/1990 | Lee et al. | |
| 5,878,352 A * | 3/1999 | Souissi et al. | 455/503 |
| 5,930,721 A | 7/1999 | Fried et al. | |
| 6,144,415 A | 11/2000 | Patton et al. | |
| 6,169,618 B1 * | 1/2001 | Higashino | 398/197 |
| 6,294,896 B1 | 9/2001 | Champlin | |
| 6,377,082 B1 | 4/2002 | Loinaz et al. | |
| 6,489,803 B1 * | 12/2002 | Steiner et al. | 326/31 |
| 6,492,929 B1 | 12/2002 | Coffey et al. | |
| 6,799,131 B1 * | 9/2004 | Steiner et al. | 702/107 |
| 6,831,521 B1 * | 12/2004 | Abidin et al. | 330/308 |

OTHER PUBLICATIONS

Giga, "2.5 Gbit/s Clock and Data Recovery GD16522", Data Sheet Rev. 20, Giga, Sep. 25, 2000, pp. 1-11.

Maxim, "2.5Gbps, Low-Power, +3.3V Clock Recovery and Data Retiming IC", Maxim Integrated Products, 1998, pp. 1-8.

* cited by examiner

*Primary Examiner*—Young T. Tse
(74) *Attorney, Agent, or Firm*—Zagorin O'Brien Graham LLP

(57) ABSTRACT

A loss-of-signal (LOS) condition is detected by sampling input data for a predetermined time period, comparing a magnitude of the sampled input data to a threshold signal strength level, and asserting a LOS indication if the number of samples that have signal strength less than the threshold signal strength level is less than a predetermined value.

43 Claims, 14 Drawing Sheets

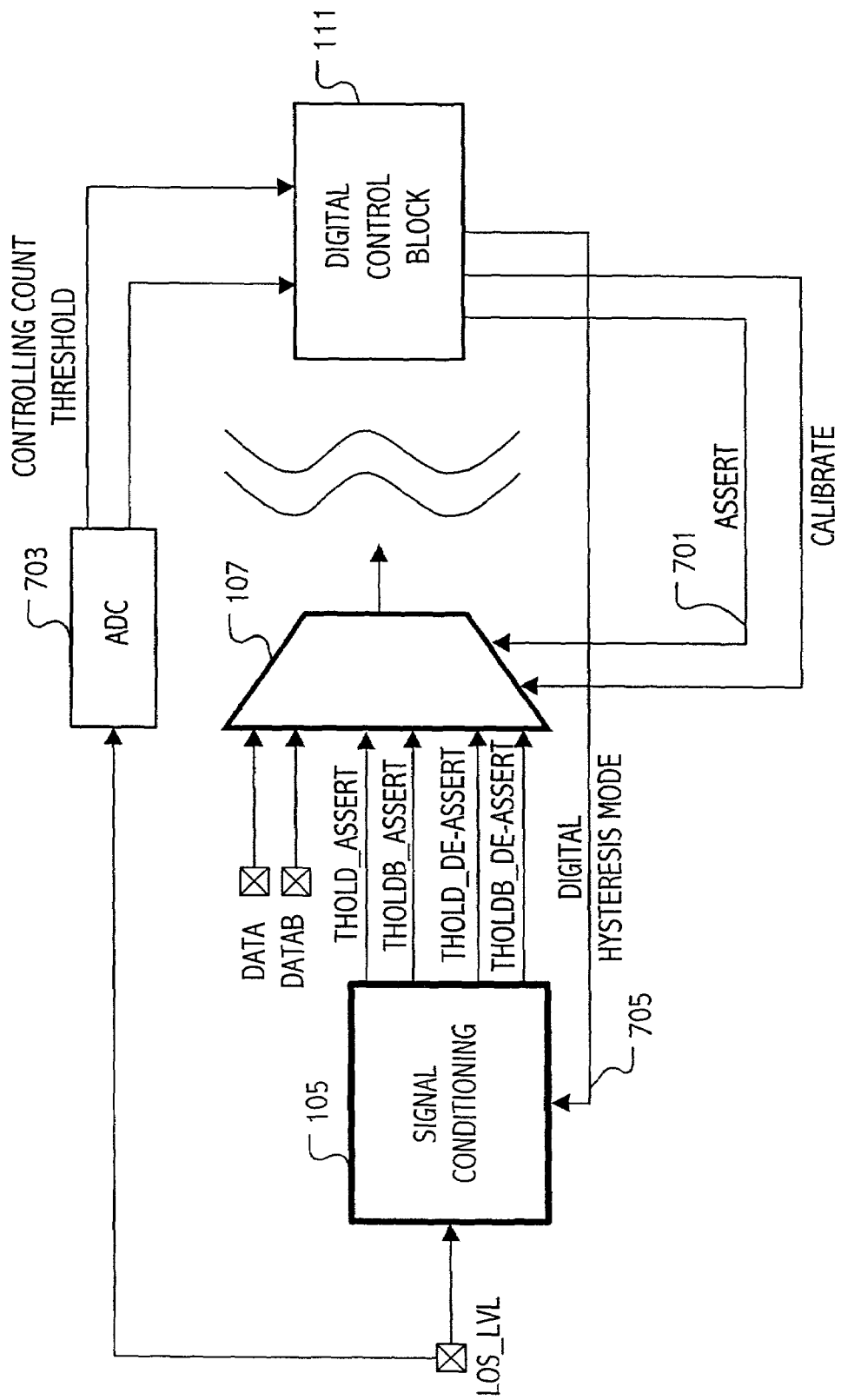

METHOD AND APPARATUS FOR DETERMINING A LOSS OF SIGNAL CONDITION

CROSS-REFERENCE TO RELATED APPLICATION

This application claims the benefit under 35 U.S.C. § 119(e) of U.S. Provisional Application No. 60/302,912, filed Jul. 3, 2001, which application is incorporated herein by reference in its entirety.

BACKGROUND OF THE INVENTION

1. Field of the Invention

This invention relates to integrated circuits used in communication systems and more particularly to detection of loss of signal conditions associated therewith.

2. Description of the Related Art

Interruptions occur in data transmission for a variety of reasons such as equipment failure, a cut cable or excessive attenuation of the signal. When such an interruption occurs, it is typical for the intended receiver in the data transmission system to detect the failure condition and inform the communication system of the existence of the failure. Many communication systems specify various aspects of detecting such loss of signal (LOS) conditions. For example, the Synchronous Optical Network (SONET) specification requires that LOS be raised when the synchronous signal (STS-N) level drops below the threshold at which a bit error rate (BER) of $1 \times 10^{-3}$ is predicted.

A clock and data recovery circuit operating in such a communication system typically receives the input data stream as a differential signal. One approach to detecting loss of signal conditions has been to rectify the received signal and compare the received signal to a reference level. Peak detection has also been used. However, such loss of signal techniques has been typically implemented in bipolar technologies. Their implementation in CMOS technologies is difficult. Since it may be desirable to implement various designs in CMOS from cost and ease of manufacturing as well as for power and performance reasons, it would be desirable to have a loss of signal approach that could be implemented in CMOS.

SUMMARY OF THE INVENTION

Accordingly, in one embodiment of the invention, a method is provided for determining existence of a loss-of-signal (LOS) condition for an input data stream. The method includes comparing signal strength of a plurality of data bits of the input data stream to a signal strength threshold level and generating an indication thereof. A count value is generated based on the comparison and a loss-of-signal indication is asserted based on the count value.

In another embodiment, a method is provided for determining existence of a loss-of-signal condition that includes determining for a plurality of data bits of an input data stream whether signal strength of each of the data bits is above or below a signal strength threshold level. A loss of signal condition exists if a predetermined number of the data bits have signal strength below a threshold level.

In another embodiment a method is provided for determining existence of a loss-of-signal (LOS) condition that includes sampling input data, comparing a magnitude of the sampled input data to a threshold signal strength level, and asserting a LOS indication if a number of samples having signal strength less than the threshold signal strength level is more than a predetermined count value.

In still another embodiment, an integrated circuit is provided for receiving input data and generating a loss of signal (LOS) indication associated therewith that includes a register circuit coupled to sample the input data and store a first value when signal strength magnitude of the sampled input data is above a signal strength threshold level and store a second value when signal strength magnitude of the input data is below the signal strength threshold level. A counter circuit is coupled to count according to an output of the register circuit.

BRIEF DESCRIPTION OF THE DRAWINGS

The present invention may be better understood, and its numerous objects, features, and advantages made apparent to those skilled in the art by referencing the accompanying drawings.

FIG. 7 shows details of the hysteresis system used in an embodiment of the invention.

The use of the same reference symbols in different drawings indicates similar or identical items.

DESCRIPTION OF THE PREFERRED EMBODIMENT(S)

Figure 1:
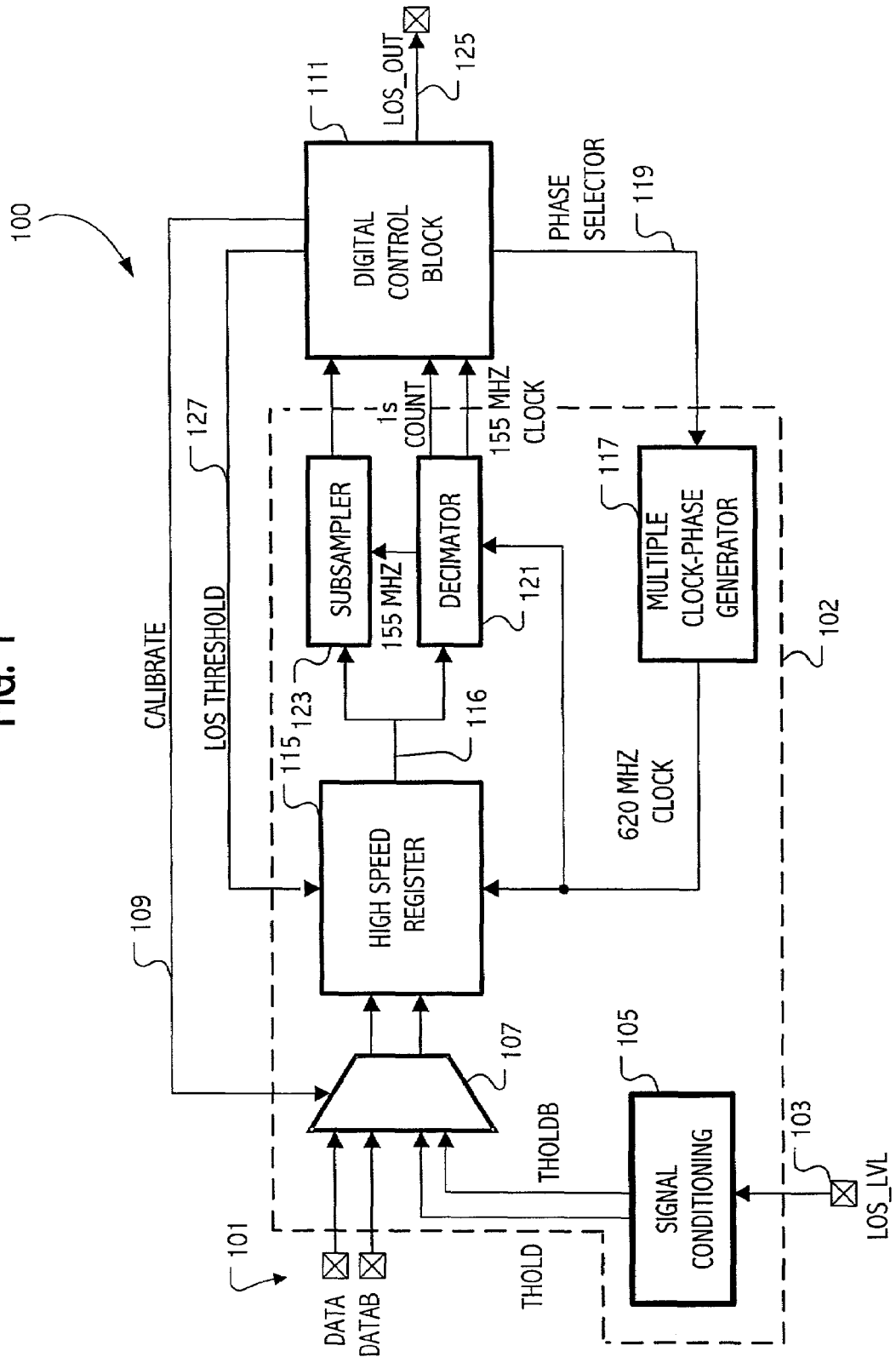
FIG. 1 shows a block diagram of an embodiment of a LOS system according to the present invention.

FIG. 1 shows a block diagram of one embodiment of the LOS system 100 according to the present invention. The loss-of-signal (LOS) system utilizes a sampled-data approach, which samples the input data at regular intervals and compares the magnitude of the sampled input data to a threshold signal strength level. If the number of samples that have a signal strength above the signal strength threshold exceeds a count threshold, then a LOS indication is not asserted. However, if the number of samples with signal strength greater than the threshold is less than the count threshold, then the LOS indication is asserted, thereby indicating that the LOS condition exists.

The input data 101 comes into the system differentially. The voltage on the LOS_LVL input terminal 103 determines the user-defined LOS threshold level. In another embodiment, the threshold may be fixed or may be provided via, e.g., a serial communication port.

The signal conditioning block 105 converts this single-ended input into a differential signal and applies a gain so that the value of the differential signals (thold–tholdb) represents the desired LOS signal strength threshold. Both the differential data and the differential LOS threshold level are fed into a multiplexer 107. The value of the calibrate signal supplied on node 109 from the digital control block 111 determines the output of the multiplexer 107. When the calibrate signal is asserted, the differential threshold signals thold and tholdb are passed to the output of multiplexer 107. When the calibrate signal is deasserted, data and datab are passed to the output of multiplexer 107. The output of the multiplexer is used as the input to the sampling circuit, implemented in the illustrated embodiment as high-speed register 115, which functions as a differential-input, single-ended output register.

The output of the high-speed register 115, conveyed on node 116, is a single-ended digital signal. Multiple clock-phase generator 117 generates the 620 MHz clock used as the sampling clock for the high-speed register 115. The multiple clock-phase generator 117 outputs a 620 MHz clock whose phase is controlled by the phase selector signal 119 supplied from the digital control block 111. The high speed register 115 feeds the single-ended digital signal on node 116 to two distinct blocks, a decimator 121 and a subsampler 123.

The decimator block 121 has two functions. First, it divides down the 620 MHz clock to produce a 155 MHz clock. Secondly, it counts the digital high values coming out of the high-speed register 115 and decimates this count by a factor of four. Functionally, the resulting output is a signal clocked at 155 MHz, which pulses high after every four digital high outputs of the high-speed register. That functional description differs somewhat from one embodiment of an implementation, which is described further herein.

The subsampler block 123 functions as a register, which resamples the output of the high-speed register 115 using the 155 MHz clock generated by the decimator 121. The outputs of the decimator 121 (both the clock and decimated count) and the subsampler are passed to a digital control block 111. The digital control block controls the calibrate signal 109, the phase selector signal 119, and LOS threshold signal 127, which are used to configure the rest of the blocks while implementing the LOS approach described herein. In addition, the digital control block 111 controls the calibration of the system.

During calibration, the digital control block 111 stores a digital representation corresponding to the value of the LOS threshold level. The digital control block 111 uses the stored digital value corresponding to the LOS threshold level to set the level at which the high-speed register 115 latches a one or a zero, using the LOS threshold signal conveyed on node 127. The digital control block 111 also monitors the decimated count from the decimator in order to determine when to assert the LOS indication 125 (LOS_OUT). Since the digital control block operates at a rate significantly slower than the input data rate and slower than high-speed register 115 (e.g., in one embodiment no input or output of the digital control block operates at a rate faster than 155 MHz), the power used by the digital control block is reduced and the use of digital synthesis and place-and-route tools to generate the digital control block is facilitated, which simplifies the design. Note that the clock rates described herein are exemplary and that different clock rates may be suitable for different systems.

Figure 2:
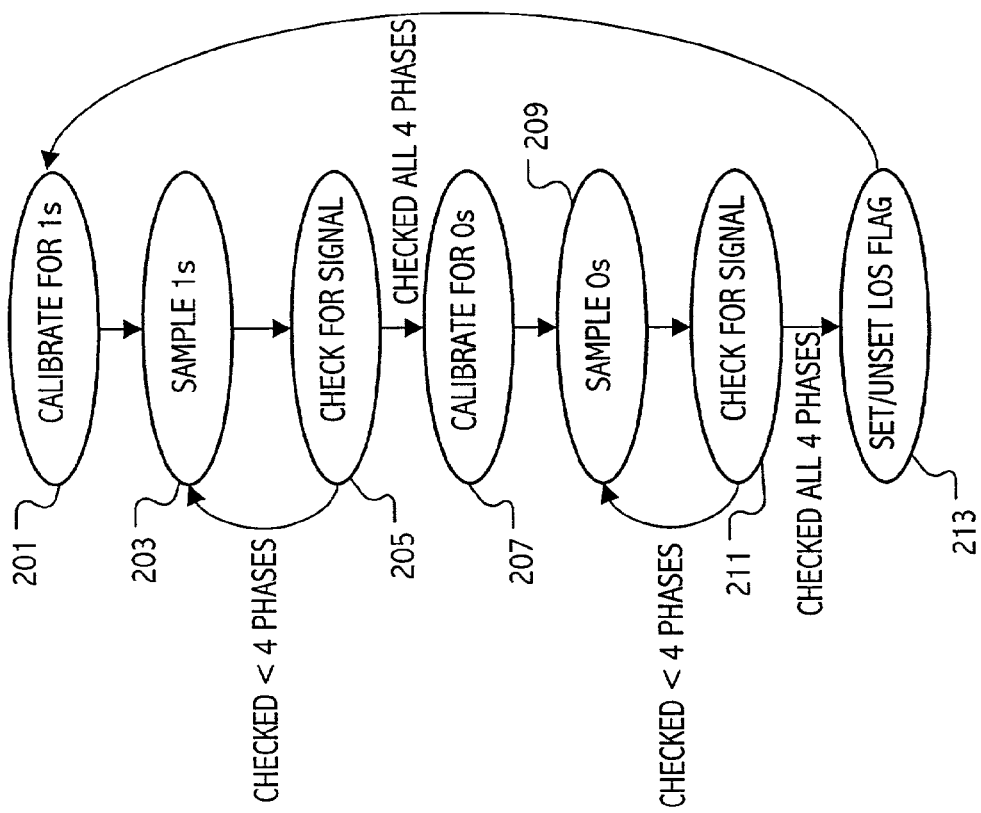
FIG. 2 shows a high level description of the LOS algorithm utilized in an embodiment of the invention.

In a preferred embodiment, the digital control block 111 is implemented as one or more finite-state machines (FSM), which set the various control signals and implements the LOS algorithm. A high level description of the LOS algorithm is shown in FIG. 2. The algorithm begins with a calibration routine in 201. During calibration an offset value corresponding to the user-defined threshold is stored in digital form in the digital control block 111. The calibration serves to negate the effects of systematic variations due to processing as well as drift caused by such factors as temperature variations. The details of the calibration are discussed further herein.

Once the calibration has finished, the threshold of the high-speed register 115 is set to the value of the LOS threshold. That is, the high-speed register 115 will latch a one if the differential input signal to the high-speed register is greater than the LOS threshold. Due to the differential nature of the input signal and the method of storing the LOS threshold level, the high-speed register 115 does not compare the LOS threshold to the digital high (1s) input signal strength and the digital low (0s) input signal strength simultaneously. Therefore, the algorithm examines 1s and 0s consecutively.

Once the calibration is complete, the digital control block 111 begins to count pulses from the output of decimator 121 in 203. After a predetermined number of samples the pulse count is compared to a count threshold in 205 and the digital control block 111 records whether or not a sufficient number of samples had a signal strength greater than the LOS threshold.

When the PLL on the chip is locked to the input, the 620 MHz sampling clock used by the LOS system has a fixed, but unknown, phase relationship with the incoming data. In order to ensure that the LOS flag is not erroneously set due to a poor phase relationship between the incoming data and the sampling clock, in one embodiment, the LOS algorithm checks for signal strength using four separate 620 MHz clocks, each with a different phase. In other embodiments, the appropriate number of sample clock phases to use may vary based on factors such as data rates, clock rates, and circuit implementations, and may range from one to four or more. Note also that the sampling clock rate may be below the data rate, above the data rate, or the same as the data rate. For example, with OC-48 data (approximately 2.4 GHz data rate), the sampling rate is below the data rate in the illustrated embodiment. With OC-3 data, the sampling rate is above the data rate and with an intermediate data rate, e.g., OC-12, the sampling rate may be the same as the data rate.

Because the number of 1s and 0s may not be even and because of the possibility of long stretches of transitionless bits, it may be important to check for the signal strength for both 1s and 0's. In one embodiment, the calibration step for 0s is performed in 207 after switching the input threshold levels (thold and tholdb) provided by multiplexer 107. Once the calibration is complete in 207, the system samples a predetermined number of data bits and provides an indication of how many of the data bits have a signal strength magnitude greater than the LOS threshold (calibrated for 0s). Note that an inversion is provided in the high speed register path when sampling 0s.

In 211, the algorithm checks if a sufficient number of the samples obtained in 209 had a signal strength greater than the threshold signal strength and records the result. The algorithm repeats sampling and checking for signal strength according to the signal strength count for all four clock phases. Finally, in 213 the algorithm asserts the LOS_OUT flag indicating a loss-of-signal condition only if insufficient signal strength was observed for all four clock phases during both measurements for 1s and for 0s. Otherwise, the LOS_OUT flag is deasserted to indicate no loss-of-signal condition exists.

In another embodiment, rather than calibrating for 0s, the digital control block digitally inverts the 1's threshold value, and provides, e.g., a two's complement value of the 1's LOS threshold value as the 0's LOS threshold value. Note that the drift caused by temperature is relatively slow so that the lack of 0 calibration when using the inverted 1's threshold value, introduces only a small amount of error.

In addition, in another embodiment, the last calibrated value may be stored for 1s, or 0s, or both so the calibration time may be reduced.

In another embodiment, an average of a plurality of calibration cycles can be used. The stored average is used as the initial value for the calibration cycle. Use of the stored average allows fewer samples to be averaged during calibration. For example, rather than averaging, e.g., 32 samples, in this embodiment after ten samples are received by the digital control block, the last sample is used for that calibration cycle. That value is then averaged with the stored average and used as the calibrated value. In order to neglect calibration values from a long time ago and to keep the adders and registers used to implement the averaging operation of reasonable size, the average is preferably implemented as a moving average using any of a variety of filtering techniques known to those of ordinary skill in the art.

Figure 3:
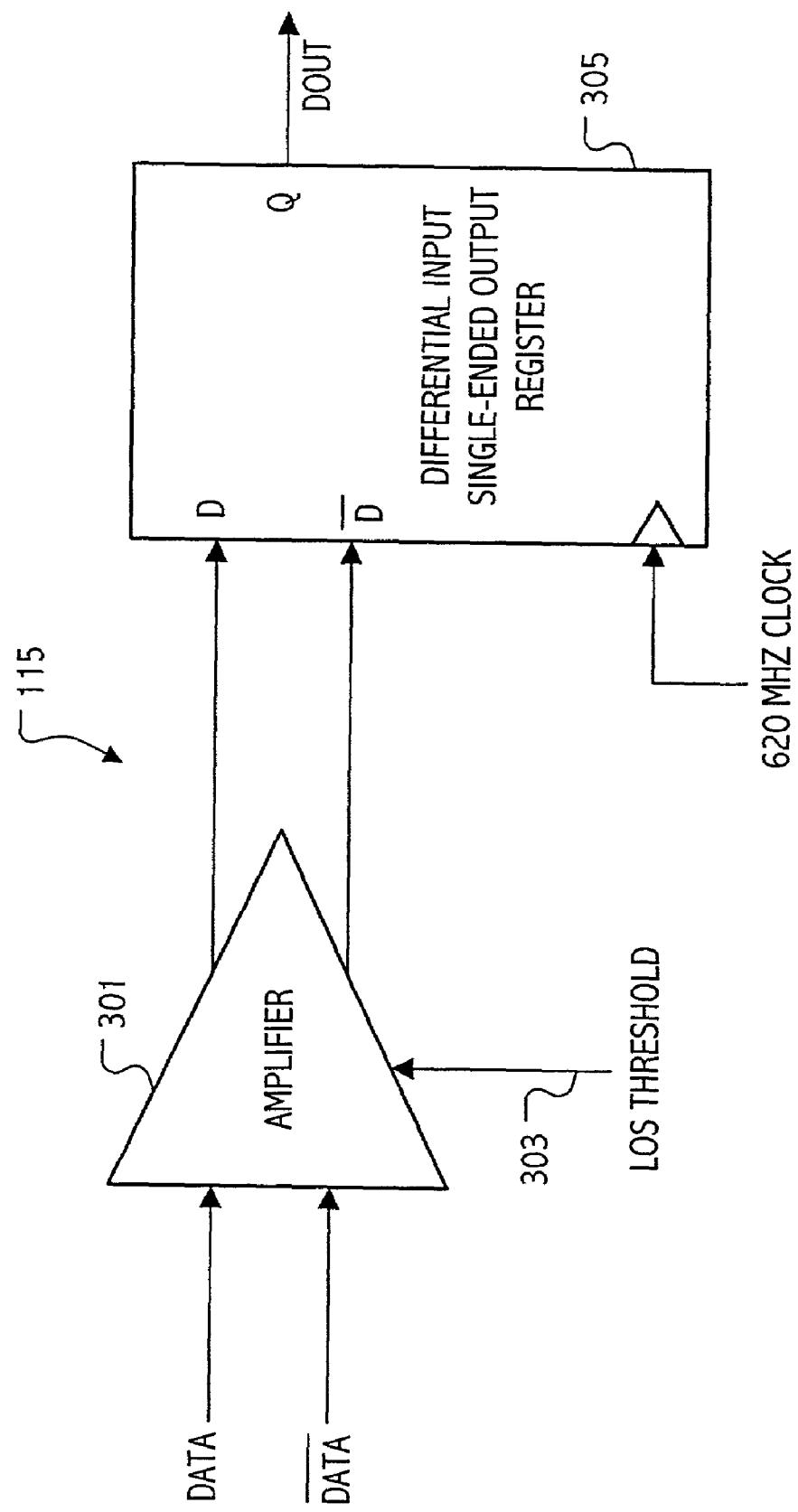
FIG. 3 shows a functional block diagram of the high-speed register shown in FIG. 1.
Figure 4:
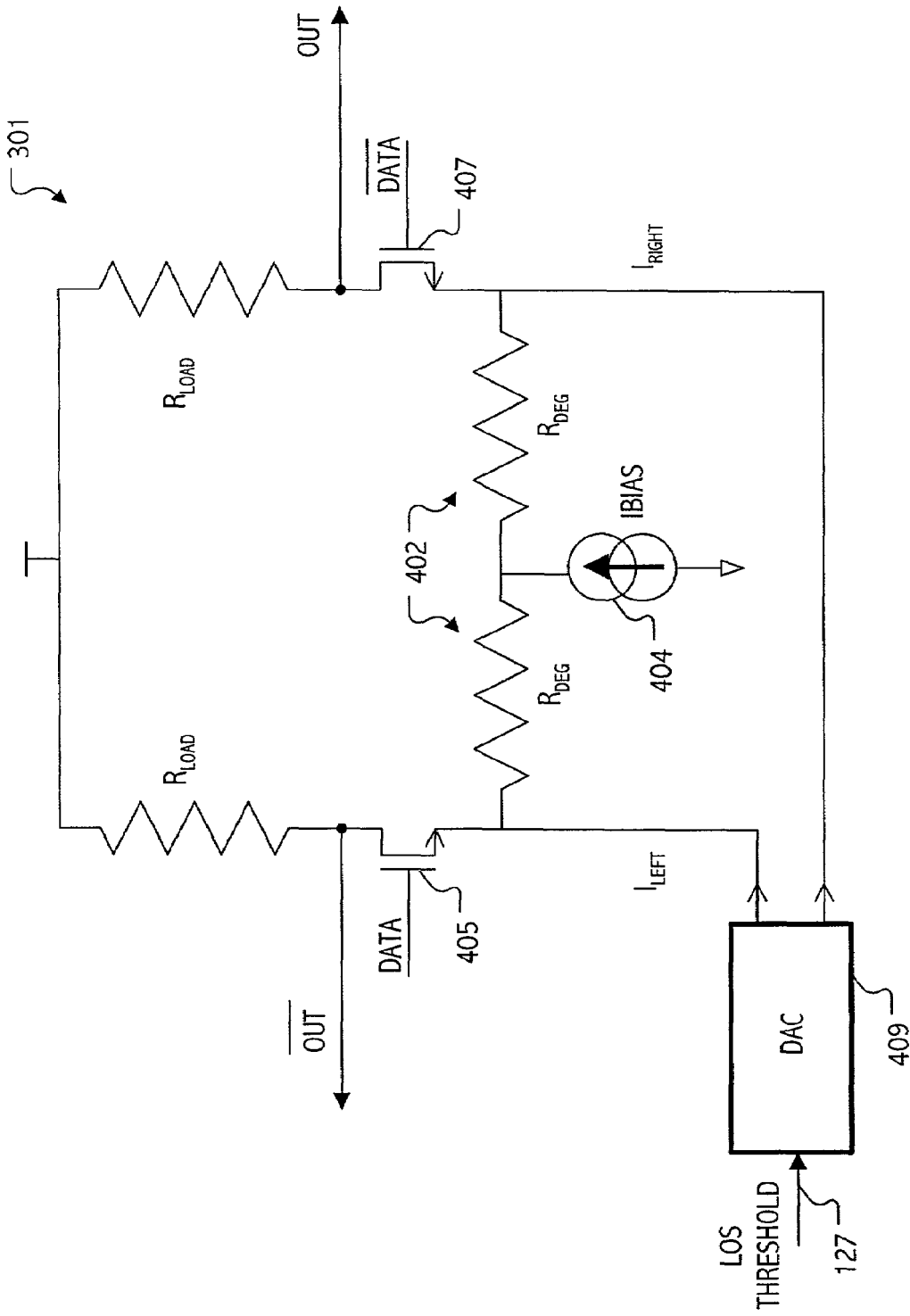
FIG. 4 shows additional details of the programmable offset amplifier shown in FIG. 3.

Turning now to additional details of one embodiment of the invention, a functional diagram of the high-speed register 115 is shown in FIG. 3. The high speed register block includes an amplifier 301 with a programmable offset 303, and a differential-input/single-ended-output register 305. FIG. 4 shows additional details of the programmable offset amplifier 301. The amplifier includes a Gm-R stage with two degenerating resistors 402. A constant bias current 404 is connected to the virtual ground node between the two degenerating resistors 402 and the source nodes of the input NMOS transistors 405 and 407 are connected to the output of a digital-to-analog converter (DAC) 409. The DAC 409 converts the digital input word, LOS threshold 127, into a differential current, ($I_{RIGHT}-I_{LEFT}$). That differential current changes the offset of the amplifier.

Figure 5:
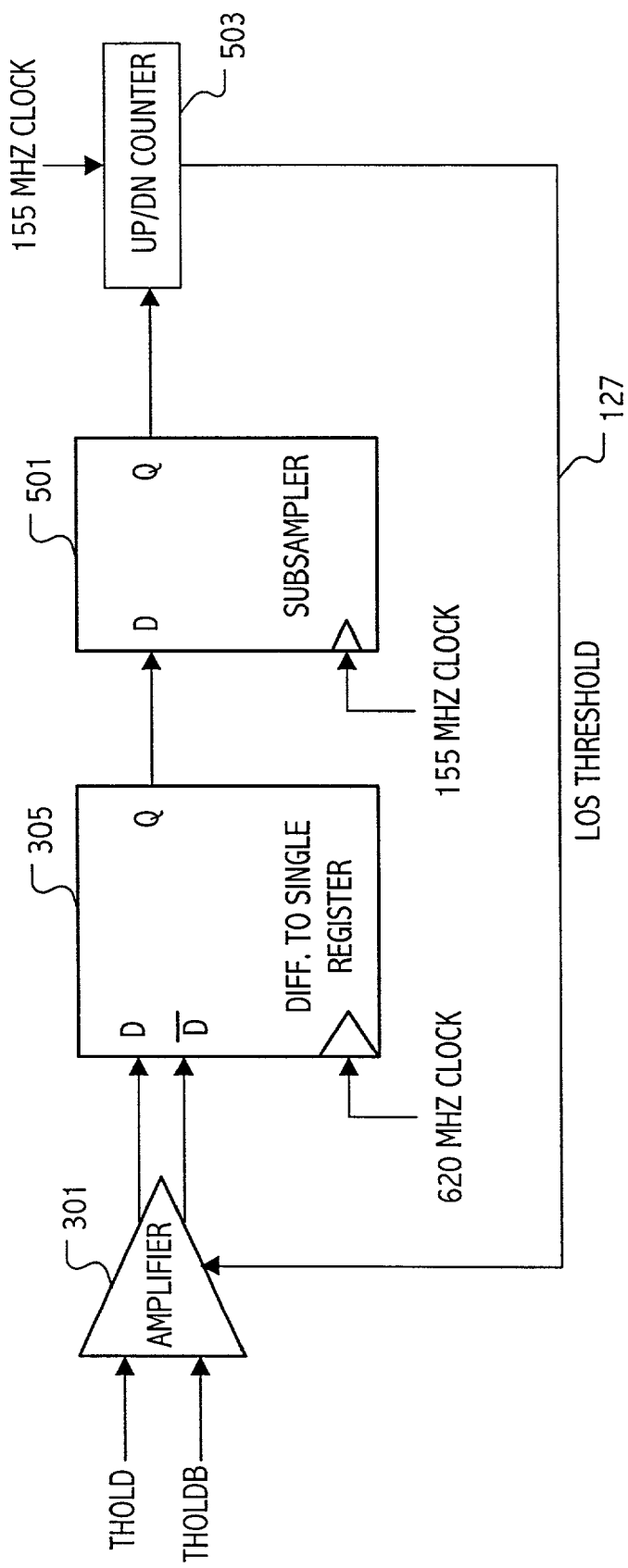
FIG. 5 shows a functional representation of the calibration utilized in an embodiment of the invention.

FIG. 5 illustrates a functional representation of the calibration. During calibration, the calibration signal 109 (FIG. 1), which functions as a multiplexer select signal, is set so that the multiplexer 107 passes thold and tholdb, the LOS threshold level, to its output. The differential threshold is input to the amplifier 301. The output of amplifier 301 is passed as the input to register 305, which samples its input at 620 MHz. The output of register 305 is passed to a second register 501, which functions as the subsampler 123 and subsamples (undersamples) the signal at 155 MHz. The output of subsampling register 501 is used as the control bit of an up/down counter 503 in the digital control block 111. The state of this counter stores the digital representation of the LOS threshold, which is passed on node 127 to the amplifier and applied as the offset to the amplifier.

Assume that the amplifier 301 has a systematic offset associated with it, $V_{os-amp}$, and a gain, G. Since the output of the amplifier can still be small, the systematic offset of the first register, $V_{os-reg}$, is also important. Therefore, the first register will latch high when $G(thold-tholdb)>GV_{os-amp}+V_{os-reg}+G(LOS$ threshold$)$ or $$G(thold - tholdb) > GV_{os-amp} + V_{os-reg} + G(LOS \text{ threshold}) \quad (2)$$

or $$LOS \text{ threshold} < (thold - tholdb) - V_{os-amp} - \frac{V_{os-reg}}{G}$$

During calibration the output of the first register (and hence the sub sampler) will be a digital high as long as equation (2) is true. The counter state will increase until equation (2) is not true, at which point the output of the subsampler will be a digital low and the counter will count down, which in turn causes equation (2) to be true again and the subsampler outputs a digital high. In this way the state of the up/down counter "bangs" between the two states closest to the actual value of the right-hand side of equation (2). When calibration ends, one of these two states is selected and the counter is disabled. The calibrate signal 109 is deasserted so that the input data is passed through the multiplexer 107. According to equation (2), the first register will latch a digital high when data−data$b$>thold−thold$b$ (3)

The sub sampler is used because once the counter state changes, the DAC in the amplifier requires some time to settle before the output of the amp is valid for the new offset setting. By reducing the sampling rate the subsampler only latches valid data after the amplifier has settled.

The above discussion neglects the presence of noise in the amplifier and first register as well as hysteresis in the latter. Both of these effects will cause the bang-bang system to bang between many states of the up/down counter. One way to compensate for this is to run the calibration algorithm for a fixed amount of time and then to select the most frequently occupied (the mode) state of the counter as the calibrated value. That approach can be difficult to implement efficiently with digital circuitry. An alternative is to take the average value of the states of the counter as the calibrated value. That is easily accomplished using digital circuitry, e.g., by adding and then shifting to accomplish the averaging, and proves to be almost as effective as taking the mode. Note that shifting may leave unused bits in the least significant positions. Rounding may be used to obtain greater accuracy in the average. That is, the average may be rounded up if a one exists in most significant unused bit position.

Figure 4A:
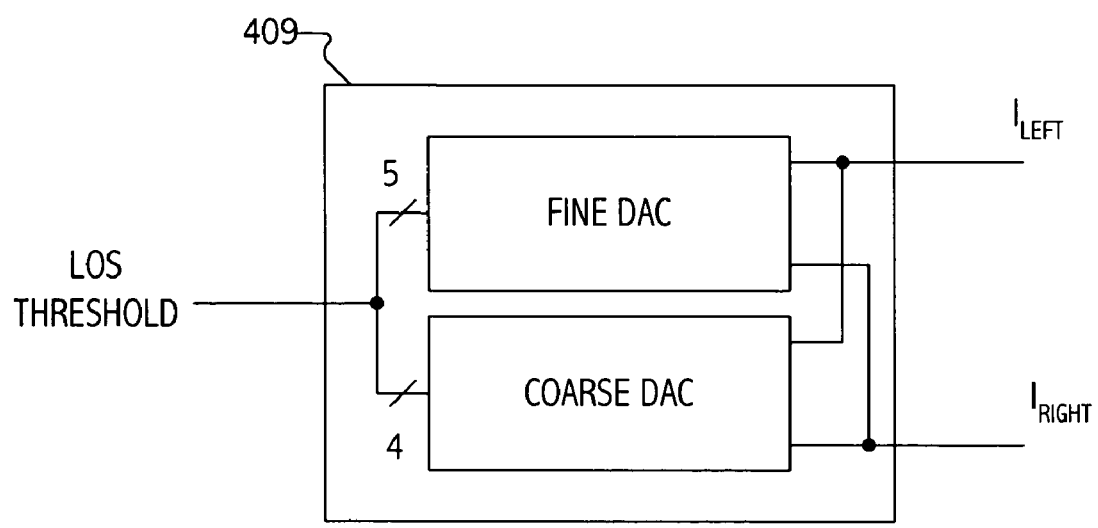
FIG. 4A shows additional details of the DAC shown in FIG. 4 consistent with at least one embodiment of the invention.

In one embodiment, referring again to FIG. 4, because of the limited monotonicity that could be provided by a single digital to analog converter, DAC 409 actually is comprised of two DACs, a coarse DAC and a fine DAC (FIG. 4A). If a single DAC is used, in which the DAC is implemented using transistors in which the ratio of the sizes is binary, a transition from one digital code, e.g., 011111 to 100000 may result in a lower current rather than a higher current because of, e.g., process variations in the transistors. Thus, there is a risk that the DAC output would not be monotonic. In one solution to this problem using two DACs, each DAC is utilized during the calibration routine as follows. The fine grained DAC is set to its midpoint and the coarse grained DAC, which receives four bits, is operated for a period of time (e.g., 16 samples) without averaging but counting the up/down counter according to the output of the subsampler 123, which allows the DAC to come close to its proper state. Then an additional number of samples (e.g., 16) are taken and a setting for the coarse grained DAC is selected based on an average of those samples.

After the calibration for the coarse DAC is complete, the fine DAC is calibrated. The fine DAC, which receives five bits, is operated for a period of time (e.g., 32 samples) without averaging but allowing the up/down counter to move according to the output of the subsampler 123, which allows the fine DAC to come close to its proper state. Then 64 samples are taken and the fine DAC is tuned to the average. In one embodiment, several of the most significant bits (MSBs) of the fine DAC and several of the least significant bits (LSBs) of the coarse DAC overlap. Note the two DACs may be implemented conventionally as digital to analog current converters in a manner known in the art.

While one embodiment utilizes an up/down counter 503, many other digital approaches, known to those of ordinary skill in the art, may be used to determine the appropriate offset value. For example, a binary search algorithm may be employed. In one such embodiment, assume the initial digital representation of the offset value is set to a center value. For ease of illustration, assume the center value is 10. If one or more samples of the LOS threshold are latched as 0s, indicating the threshold is too high, a value of 5 is selected. Again one or more samples are taken. If the sample(s) indicate that a 1 was latched by the sampling circuit, indicating the threshold is too low, a value of 7.5 is selected. The binary search continues until a sufficient number of samples have been taken and the digital representation of the offset is "banging" between several states. Again averaging of the digital representations can be used.

Once the calibrated digital representation corresponding to the LOS threshold is stored in the digital control block 111, the system can begin measuring the signal. Each time the high-speed register 115 samples the input it will output a digital high if the signal strength is greater than the LOS threshold. The hysteresis associated with high speed register can result in difficulty in accurately determining if a signal is above the signal strength threshold immediately after a transition. In the absence of noise and register hysteresis, a single digital high from the high-speed register 115 would be sufficient to indicate the presence of a signal greater than the threshold. Noise and hysteresis in the system require a more sophisticated approach for measuring signal strength. There are three cases to consider: (1) The noise is much greater than the hysteresis; (2) the noise and hysteresis are approximately the same magnitude; and (3) the magnitude of the hysteresis is much greater than the magnitude of the noise. In a broadband system such as the high-speed front end of the LOS system, the third case should not occur. The first two cases are similar in that the effects of hysteresis can be neglected in both. Some care must be taken when performing an analysis of the effects of noise and hysteresis in the system. In the first case, the hysteresis is negligible compared to the noise and therefore can be ignored. When the noise and hysteresis magnitudes are comparable, since the hysteresis is a deterministic value, the effects can be compensated in the system by altering the value of the count threshold.

In general, the effects of noise can be compensated by an averaging operation. The difficulty in this system stems from the digital nature of the output. A standard averaging operation cannot be applied to average out the noise. Instead, a pseudo averaging operation is performed by counting the number of times the high-speed register 115 latches a digital high. That counting technique proves to provide a substantial reduction in the effects of noise and a correspondingly good improvement in the accuracy of the measurement.

The output of the high-speed register 115 is a 620 Mb/s data stream. Counting is an inherently digital operation, which can require a substantial number of registers and combinational logic. It would be preferable to perform the counting at a lower data rate for a number of reasons. First, it would require less power and second, it would facilitate the use of synthesis and place-and-route CAD tools. The function of the decimator is to allow the main counting function to run at a relatively low speed, e.g., 155 MHz.

Figure 6A:
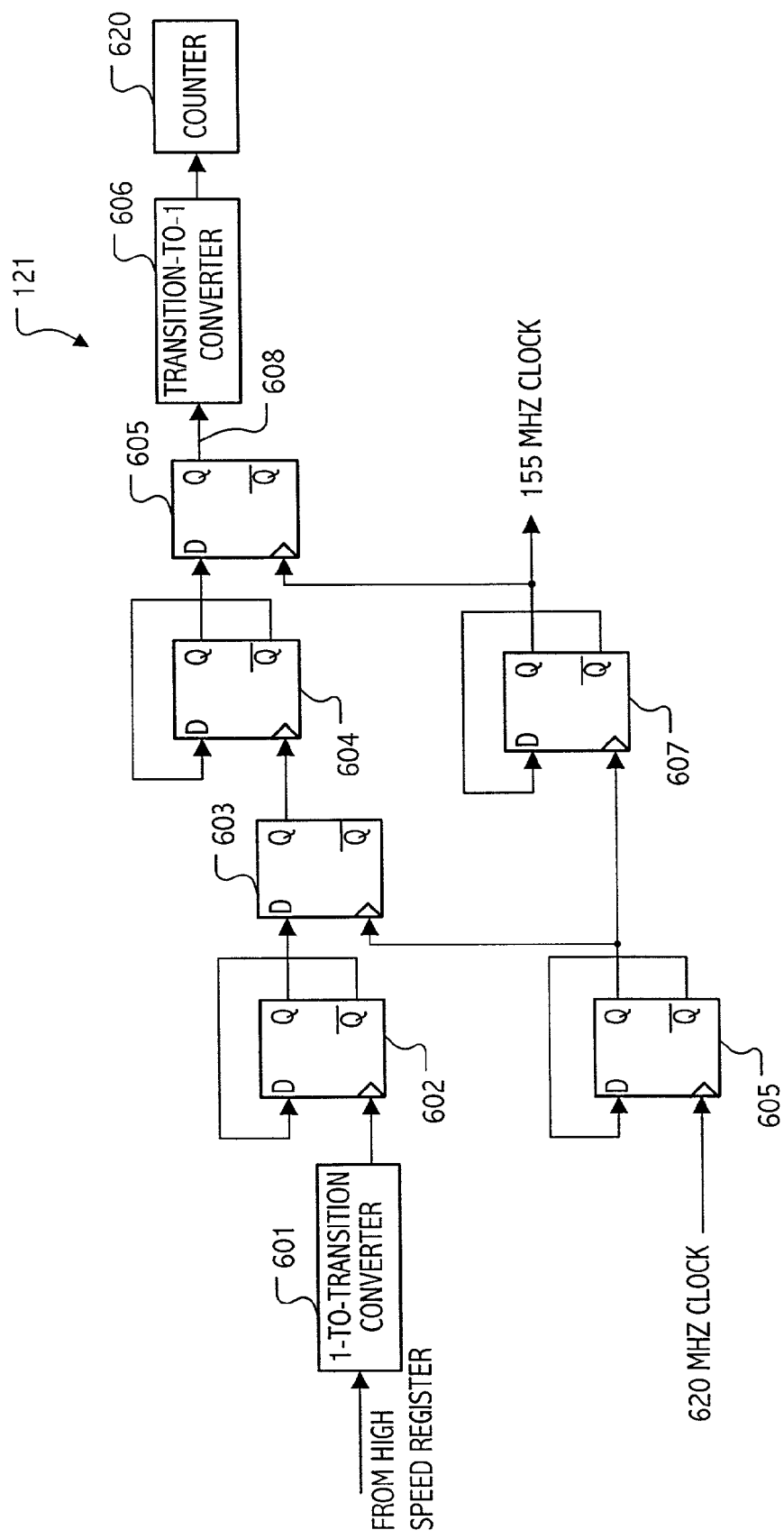
FIG. 6A shows a functional diagram of the decimator shown in FIG. 1
Figure 6C:
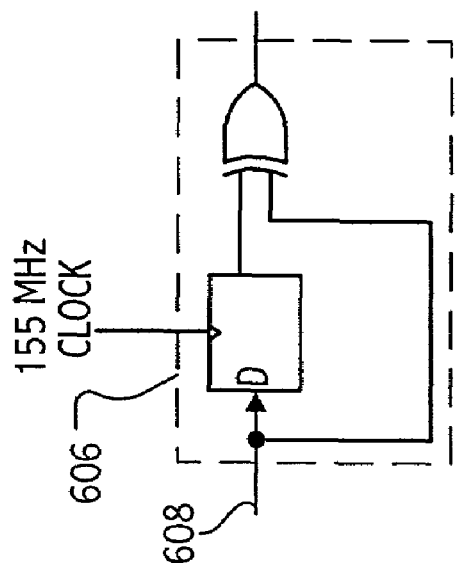
FIG. 6C shows additional details of the transition-to-1 converter shown in FIG. 6A.
Figure 6B:
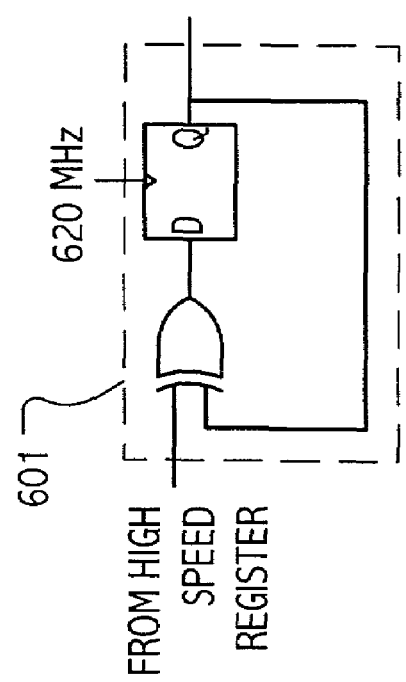
FIG. 6B shows additional details of the 1-to-transition converter shown in FIG. 6A.

FIG. 6A shows a functional diagram of the decimator 121. The output of the high-speed register 115 is passed through a 1-to-transition converter 601 (shown in additional detail in FIG. 6B), which produces a transition every time the high-speed register 115 latches a digital high. These transitions are then passed through an asynchronous divide by four using D flip-flops 602 and 604. The data in the decimator is resampled at the output of each divider in flip-flops 603 and 605 using the divided down clocks, which minimizes any skew between the data and the clock.

The resulting output from the divide by four is passed through a transition-to-1 converter 606 (shown in additional detail in FIG. 6C), the output of which is counted using a standard digital counter 620, which is part of control block 111. The advantage of this method is that the counting can be performed at the lower rate. Note that in one embodiment, the two LSBs of the count are lost so that the accuracy of the count is limited in one particular embodiment. The counted value is then compared to the count threshold value to determine whether a loss of signal condition exists. If so, that result is stored as the other phases are examined. Remember, that in one embodiment, all four phases for both ones and zeros are examined before a final LOS determination is made.

In one embodiment, each sample period is 512 high speed register samples. That results in 128 samples that can be counted by the counter in the digital control block. Assuming that half of the samples are 1s and half are 0s, an idealization of typical conditions, sampling for 1s (or 0s) would result in at most 64 bits above threshold signal strength. However, there are bandwidth problems associated with the high speed register. More particularly, it can be difficult to detect a bit right after a transition, and thus assuming half of the bits are transitions, at most 32 bits would be seen as having signal strength above the threshold level. In one embodiment, if the counted bits having signal strength above the signal strength threshold is above 15, the loss of signal indication is negated indicating that no loss of signal condition exits. Alternatively, if the count is less than 15, a loss of signal condition is assumed to exist.

The count threshold can be adjusted to account for noise and bandwidth limitations. The bandwidth limitations result in gain degradation at high frequency. Thus, if the LOS threshold is set relatively high, for example 30 mV peak to peak, the bandwidth limitation effects present in the high-speed register may result in being able to see only 24 mV. Assuming noise is on the order of 0.5 mV, the gain degradation of 6 mV is the dominant effect and not the noise, so the noise does not have to be averaged out. Further, the signal degradation due to bandwidth limitations can result in a lower number of ones. Thus, based on the LOS level, the count threshold can be adjusted to, e.g., 2 rather than 15. On the other hand, at low LOS levels, the noise is at least as dominant as the bandwidth limitation effects and needs to be averaged out. Thus, the count threshold is increased to, e.g., 15. For LOS levels that are in the middle, the count threshold would be adjusted accordingly. In one particular embodiment, the LOS threshold is divided into four ranges: 0-6 mV, 6-9 mV, 9-13 mV and 13-30 mV with corresponding count thresholds of 18, 14, 8, and 3, respectively.

Referring again to FIG. 6A, the decimator block 121 also provides an asynchronous divide by four of the 620 MHz clock using registers 605 and 607. The resulting 155 MHz clock is used in the subsampler as well as the digital control block 111.

In some embodiments, the integrated clock and data recovery circuit may include a serial communication port to allow for programming of various threshold, count values and modes of operation. In addition, the serial communication port may supply various status information. In one embodiment, the LOS threshold may be provided digitally over the communication serial port. In addition, the number of samples to take and/or the count threshold values could be programmed for the digital control block through the serial port.

When the input signal strength is close to the LOS threshold the LOS flag (LOS_OUT) can be toggling quite rapidly as loss-of-signal events depend heavily on the specific pattern of system noise. In order to avoid this "noisy" behavior of the LOS flag, hysteresis is preferably implemented in the system. Note that this "hysteresis" is intentional delay implemented in the system, whereas the register hysteresis described earlier is due to circuit effects, which results in a need for more drive to cause a transition in the register. FIG. 7 shows details of the hysteresis system. In one embodiment, the signal conditioning block 105 outputs two differential threshold signals to the multiplexer 107. The thold-assert and tholdb-assert signals are the threshold signals used when the LOS flag is unasserted while thold_de-assert and tholdb_de-assert are the threshold signals used when the LOS flag is asserted. Typically the de-assert threshold is higher than the assert threshold in order to prevent the rapid toggling of the LOS flag. The digital control block 111 controls which LOS threshold is used during calibration with the assert signal 701.

As will be explained further herein, the signal conditioning block 105 produces the thold_de-assert and tholdb_de-assert signals as scaled-up versions of the thold-assert and tholdb-assert signals. In the illustrated embodiment, the gain is 3 dB. At the lowest LOS thresholds, however, 3 dB of hysteresis can be less than the accuracy of the system. In those circumstances the 3 dB of hysteresis would not prevent the "noisy" behavior of the LOS flag. In order to prevent this from occurring, two hysteresis modes are implemented in the LOS system. The voltage on the LOS_LVL pin is passed through an analog to digital converter (ADC) 703, which provides its output to digital control block 111. When the LOS_LVL voltage (and hence the LOS threshold) is smaller than a specified value, as indicated by the signal provided by ADC 703, digital block 111 provides a fixed amount of hysteresis as described further herein. In one embodiment the fixed amount is 5 mV differential peak-to-peak. If the digital control block supplies the hysteresis, the hysteresis mode signal 705 is asserted and the signal conditioning block 105 passes thold-assert and tholdb-assert to both its differential outputs as described with relation to FIG. 8. When the LOS_LVL voltage is above the specified value, the digital hysteresis is disabled and the thold-de-assert and tholdb-de-assert signals are set in the signal conditioning block.

Figure 8:
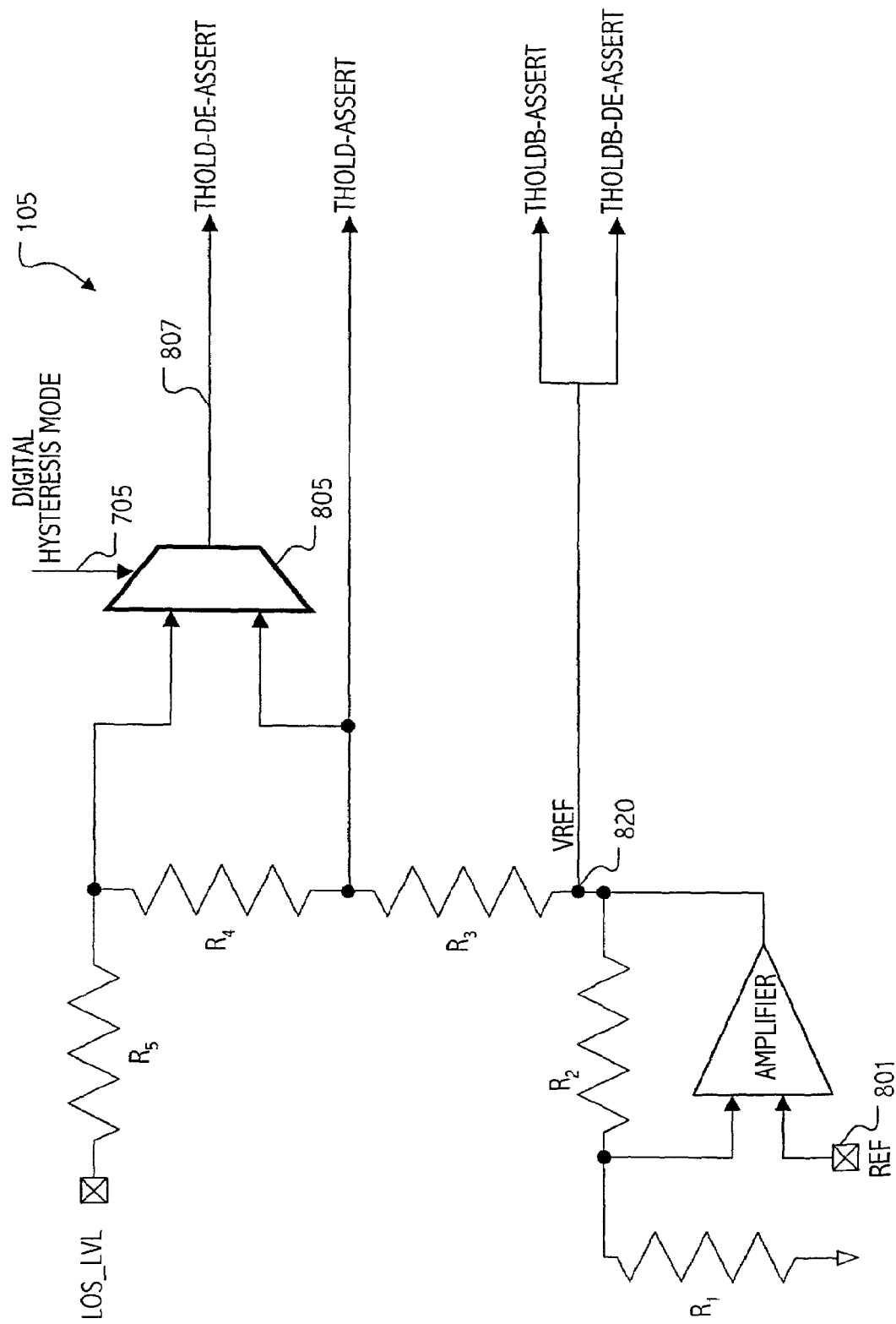
FIG. 8 shows details of the signal conditioning block shown in FIG. 1.

Details of the signal conditioning block 105 are shown in FIG. 8. Signal conditioning block 105 includes a reference generator 801, an attenuator formed by resistors $R_5$, $R_4$, and $R_3$, and a multiplexer 805. The signal conditioning block also acts as a single-ended to differential converter. The signal conditioning block functions as follows. A voltage reference on node 801 is scaled to match the common-mode of the input signal. This scaled version of the reference, VREF, (approximately 1.5 V) is used as one half of the differential signal. The second part of the differential LOS threshold signal comes from the LOS_LVL pin. The voltage on this input is attenuated and referenced to VREF. The advantage of the attenuation is that the LOS threshold will typically have a range of only a few mV. The attenuator allows the user to supply a voltage on the LOS_LVL pin, which is much less accurate than the LOS threshold values.

As previously discussed, the thold-de-assert signal is a scaled-up version of the thold-assert signal when analog hysteresis mode is enabled. When the system is using digital hysteresis, the thold-assert signal is fed through the multiplexer 805 to the thold-de-assert output conveyed on node 807.

Figure 9:
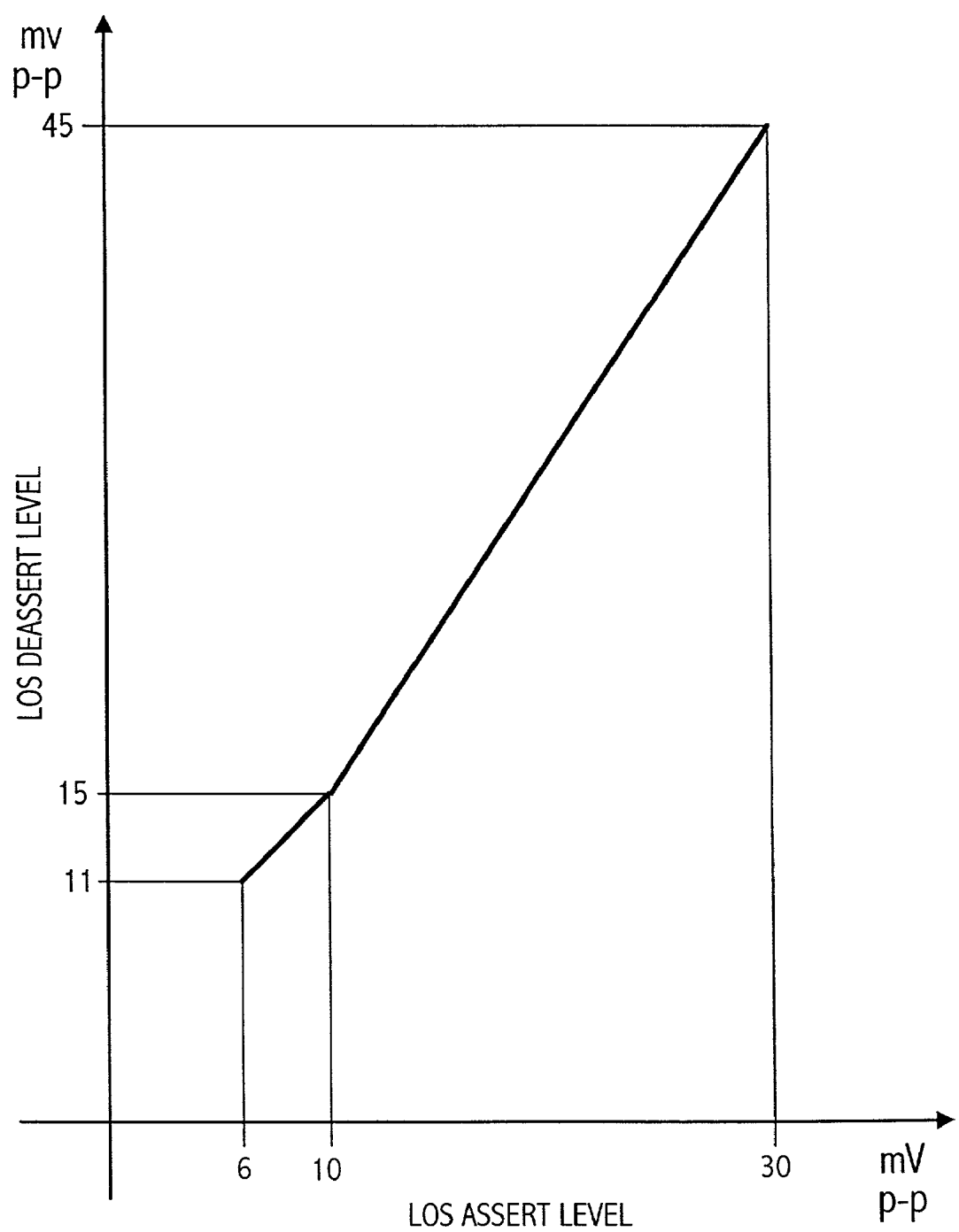
FIG. 9 illustrates the use of digital hysteresis mode according to one embodiment of the invention.

FIG. 9 illustrates the use of the digital hysteresis mode. When the LOS assert threshold is set below 10 mV, the hysteresis is static at 5 mV above the programmed value. Thus, as shown in FIG. 9, for program values of 6 mv to 10 mV, the LOS deassert level ranges from 11 mV to 15 mV to provide the 5 mV of hysteresis. For assert values above 10 mV, the hysteresis is 3 dB above the assert level. The digital hysteresis is generated by adding a digital value corresponding to 5 mV to the digital threshold representation and supplying the biased-up digital threshold representation to DAC 409 on node 127. In one embodiment, the digital hysteresis is added, if required, at the end of the calibration routine.

Rather than using analog and/or digital hysteresis circuits to provide hysteresis in desasserting the LOS indication, the count threshold can be adjusted to account for hysteresis. For example, for a specified LOS threshold level, e.g., 15 mV, a higher count threshold is used for deassertion than for assertion to provide appropriate hysteresis. Using a variable count threshold to implement hysteresis, provides the advantage of eliminating the need for the analog and digital hysteresis circuits, saving power and design effort. In combining adjustment of the count threshold for hysteresis purposes and adjustment of the count threshold based on LOS threshold level to account for noise and bandwidth limitations, the LOS threshold level may be divided into a plurality of ranges, as described previously, e.g., 0-6 mV, 6-9 mV, 9-13 mV and 13-30 mV. However, for each range there are two corresponding count thresholds. For example, for the 0-6 mV range, an assert count threshold may be 18 and a deassert count threshold may be 28. For each count range, the deassert count threshold may be biased up by an amount, e.g., 10 to provide an appropriate amount of hysteresis.

Figure 10:
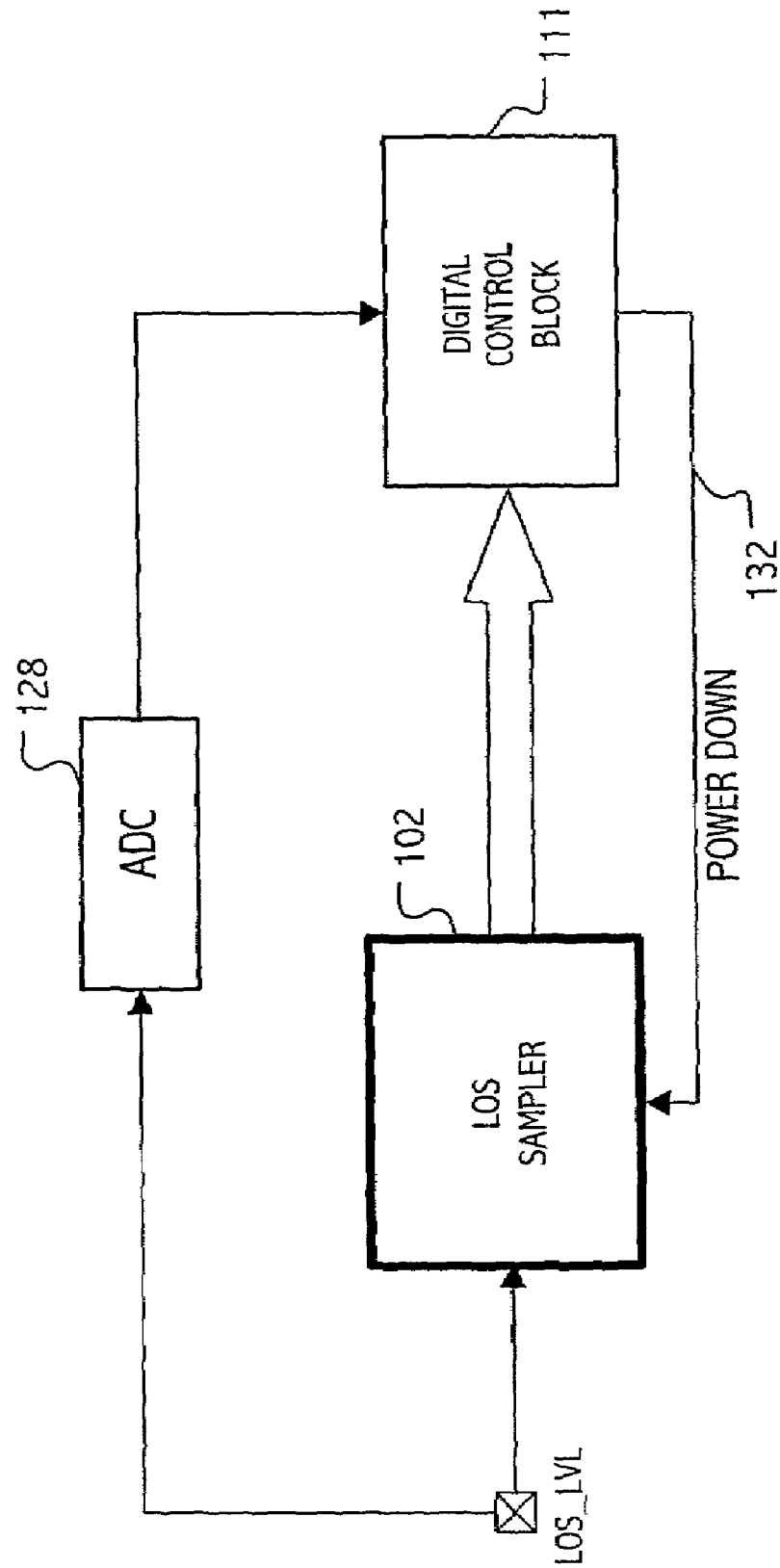
FIG. 10 shows the power down loop for the LOS system.

FIG. 10 shows the power down loop for the LOS system. The LOS_LVL voltage is passed through the analog to digital converter (ADC) 128. The digital representation of the LOS_LVL voltage is passed into the digital control block 111, which compares it to a predetermined value. That value may be programmable or fixed. When the voltage is less than the predetermined value, the digital control block 111 asserts the power down signal 132 to the LOS sample circuits 102 (see FIG. 1). The state machine in the digital control block 111 goes to a special power down state in which it simply waits for a valid signal to re-appear on the LOS_LVL pin. Powering down of the LOS sample circuits allows for more effective testing and for power savings for users not interested in utilizing the LOS feature.

In addition to providing the digital representation of the LOS_LVL voltage, the ADC 128 may also supply an indication of the LOS level utilized in determining the count threshold. The signal may be the same as the LOS_LVL or scaled differently.

Figure 11:
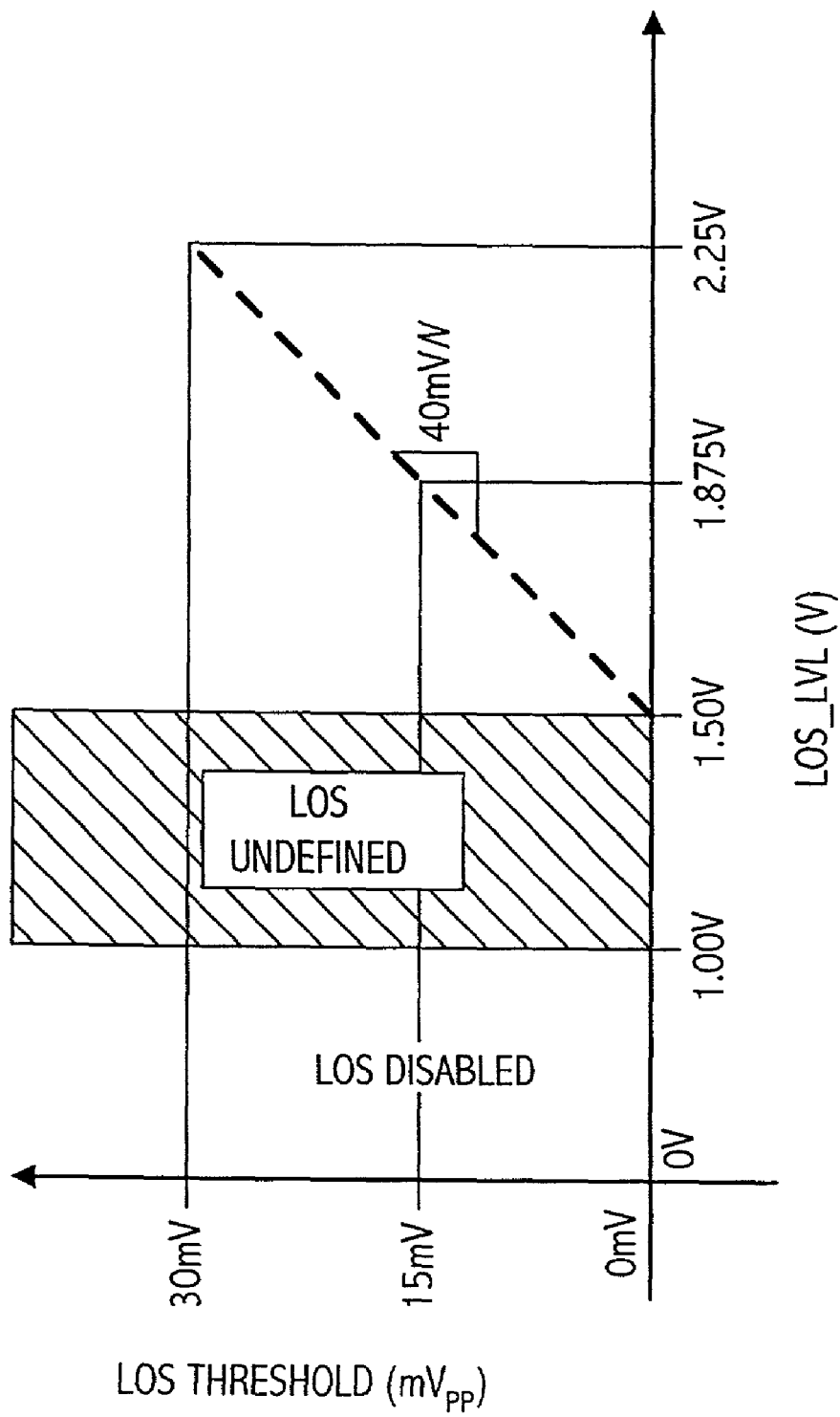
FIG. 11 shows exemplary programming on the LOS_LVL input pin to control the LOS threshold.

FIG. 11 shows the programming on the LOS_LVL input pin to control the LOS threshold. In the embodiment illustrated in FIG. 11, voltage ranges of 1.5 to 2.25 volts causes an increase in the LOS threshold of 40 mV/V. Between 1 V and 1.5 V, LOS is undefined. For values below 1 V the LOS circuitry is disabled as described in accordance with FIG. 10.

Figure 12:
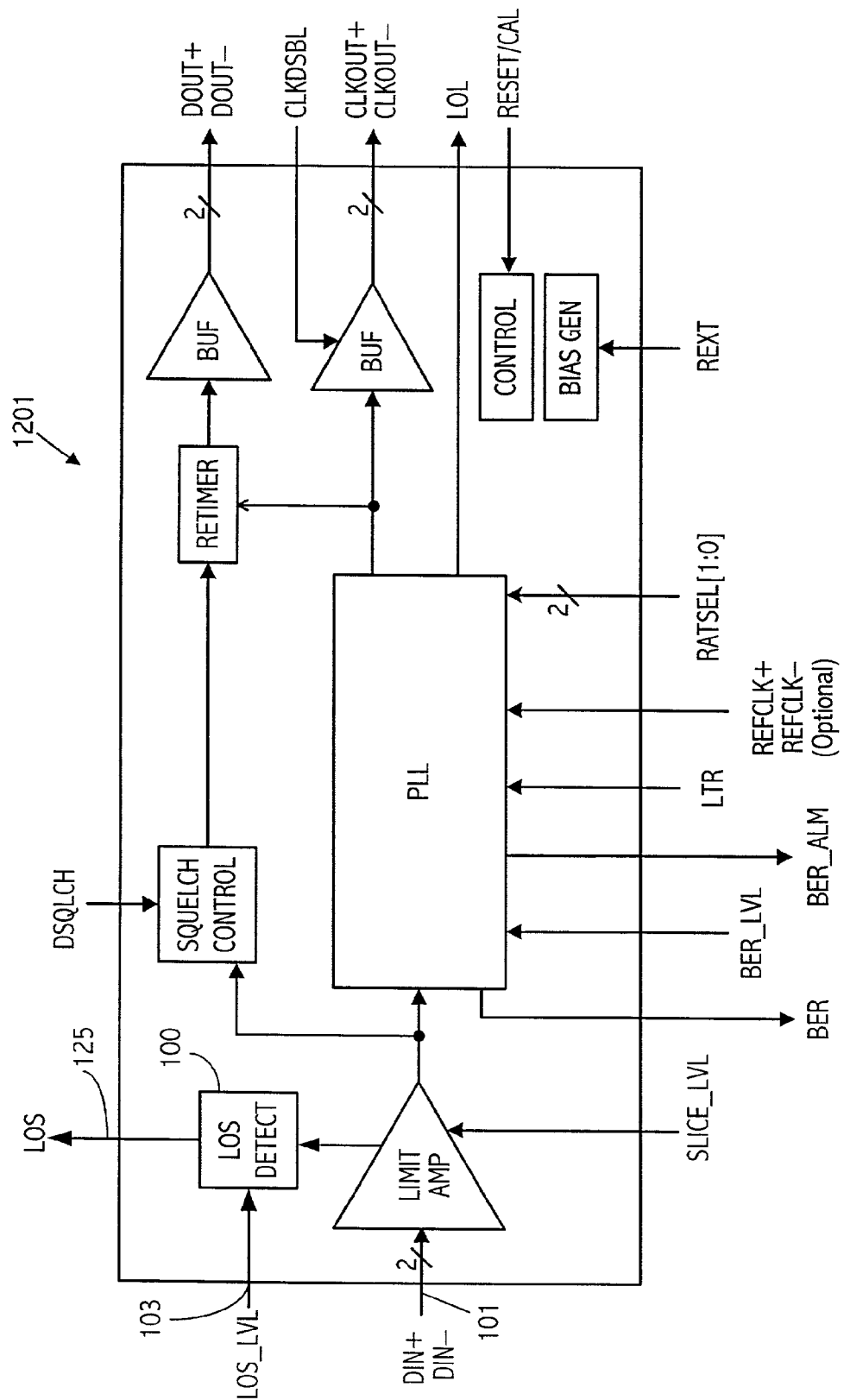
FIG. 12 shows a block diagram of the clock and data recovery circuit 1201 in which the LOS system described herein can be advantageously utilized.

FIG. 12 shows a block diagram of the clock and data recovery circuit 1201 in which the LOS system 100 described herein can be advantageously utilized.

Thus, various embodiments have been described for determining when a loss-of-signal condition has occurred. The description of the invention set forth herein is illustrative, and is not intended to limit the scope of the invention as set forth in the following claims. Other variations and modifications of the embodiments disclosed herein, may be made based on the description set forth herein, without departing from the scope and spirit of the invention as set forth in the following claims.

What is claimed is:

1. A method comprising:
   comparing signal strength of a plurality of data bits of an input data stream to a signal strength threshold level and generating an indication thereof;
   determining a count value according to the indication; and
   generating a loss-of-signal indication according to the count value,
   wherein the count value is a number of data bits having a signal strength above the signal strength threshold level.

2. The method as recited in claim 1 further comprising sampling the input data stream to obtain the plurality of data bits, a sampling rate of the sampling being below a data rate of the input data stream.

3. The method as recited in claim 1 further comprising sampling the input data stream to obtain the plurality of data bits at a sampling rate equal to or higher than a data rate of the input data stream.

4. The method as recited in claim 1 wherein generating the loss-of-signal indication comprises comparing the count value to a threshold count.

5. The method as recited in claim 4 wherein the threshold count is programmable.

6. The method as recited in claim 4 wherein the threshold count varies to provide hysteresis in generating the loss-of-signal indication.

7. The method as recited in claim 6 wherein the threshold count increases when the loss-of-signal indication is asserted.

8. The method as recited in claim 1 wherein the comparing further comprises:
   latching a first value in a register when the signal strength of a data bit of the input data stream is above the signal strength threshold level and latching a second value in the register when the signal strength of the data bit is below the signal strength threshold level.

9. The method as recited in claim 8 further comprising:
   supplying the data bit to an amplifier, which is coupled to supply the data bit to the register; and
   supplying an offset to the amplifier, the offset being at a level to cause the register to store the first value when the signal strength of the data bit is above the signal strength threshold level and to store the second value when the signal strength of the data bit is below the signal strength threshold level.

10. The method as recited in claim 9 further comprising:
    supplying a digital value indicative of the offset to at least one digital to analog converter (DAC); and
    supplying as the offset an output from the at least one DAC.

11. The method as recited in claim 9 wherein a first portion of a digital value indicative of the offset is supplied to a first DAC and a second portion of the digital value is supplied to a second DAC, the offset being formed from outputs of the first and second DACs.

12. The method as recited in claim 11 wherein at least a portion of the digital value supplied to the first and second DACs overlap.

13. The method as recited in claim 8 wherein the register is clocked at a rate below a data rate of the input data stream.

14. The method as recited in claim 13 further comprising decimating an output of the register and supplying the decimated output as a count control signal to a counter to determine the count value.

15. The method as recited in claim 14 wherein the decimating comprises:
    supplying the output of the register to a one-to-transition converter;
    dividing an output of the one-to-transition converter;
    supplying the divided output to a transition-to-one converter; and
    supplying an output of the transition-to-one converter as the count control signal.

16. The method as recited in claim 1 wherein the comparing is for a predetermined number of data bits.

17. The method as recited in claim 1 wherein the comparing is performed for each of four phases of a clock before a decision is made that a loss-of-signal condition exists, the loss-of-signal condition corresponding to the loss of signal indication.

18. The method as recited in claim 1 wherein the comparing is performed for at least one phase of a clock before a decision is made that a loss-of-signal condition exists, the loss-of-signal condition corresponding to the loss of signal indication.

19. The method as recited in claim 1 wherein the comparing is repeated for a signal strength threshold for both ones and zeros before a decision is made that a loss-of-signal condition exists, the loss-of-signal condition corresponding to the loss of signal indication.

20. The method as recited in claim 19 wherein the determining for both ones and zeros is repeated for each of four phases of a clock before the decision is made that the loss-of-signal condition exists.

21. The method as recited in claim 1 wherein the signal strength threshold level is programmable via a communication port on an integrated circuit.

22. The method as recited in claim 1 further comprising calibrating the signal strength threshold level each time prior to determining whether the signal strength of a predetermined number of data bits is above or below the signal strength threshold level.

23. The method as recited in claim 22 further comprising calibrating the signal strength threshold level for ones before testing for ones and calibrating the signal strength threshold level for zeros before testing for zeros.

24. The method as recited in claim 22 wherein the signal strength threshold level for zeros is generated by negating the signal strength threshold level generated for ones.

25. The method as recited in claim 1 wherein the signal strength threshold level is defined by an analog signal on an input terminal.

26. A method comprising:
comparing signal strength of a plurality of data bits of an input data stream to a signal strength threshold level and generating an indication thereof;
determining a count value according to the indication; and
generating a loss-of-signal indication according to the count value,
wherein generating the loss-of-signal indication comprises comparing the count value to a threshold count,
wherein the threshold count varies according to an indication of the signal strength threshold level.

27. The method as recited in claim 26 wherein the count value is the number of data bits having a signal strength above the signal strength threshold level.

28. A method for determining existence of a loss-of-signal condition, the method comprising:
determining for a plurality of data bits of an input data stream whether a signal strength of each of the data bits is above or below a signal threshold level; and
determining that the loss-of-signal condition exists if a predetermined number of the data bits have a signal strength below the signal threshold level.

29. A method comprising:
sampling input data;
comparing a magnitude of the sampled input data to a threshold signal strength level; and
asserting a loss-of-signal indication if a number of samples, over a predetermined time period, having a signal strength less than the threshold signal strength level, is more than a predetermined value.

30. An integrated circuit comprising:
a sample circuit coupled to sample input data and store a first value when signal strength magnitude of the sampled input data is above a signal strength threshold level and store a second value when the signal strength magnitude of the sampled input data is below the signal strength threshold level; and
a counter circuit coupled to generate a count value according to an output of the sample circuit;
wherein the count value is a number of input data samples having a signal strength magnitude above the signal strength threshold level.

31. The integrated circuit as recited in claim 30 further comprising a comparison circuit coupled to compare an output of the counter circuit and a threshold count value and generate a loss-of-signal indication according to the comparison.

32. The integrated circuit as recited in claim 31 wherein the threshold count value varies according to an indication of the signal strength threshold level.

33. The integrated circuit as recited in claim 31 wherein the threshold count value varies to provide hysteresis in generating the loss-of-signal indication.

34. The integrated circuit as recited in claim 33 wherein the threshold count value increases when the loss-of-signal indication is asserted.

35. The integrated circuit as recited in claim 30 wherein the sample circuit includes an amplifier, the amplifier being coupled to receive an offset, the offset being at a level to cause the sample circuit to store the first value when the signal strength magnitude of the sampled input data is above the signal strength threshold level and to store the second value when the signal strength magnitude of the sampled input data is below the signal strength threshold level.

36. The integrated circuit as recited in claim 35 further comprising:
a digital control block coupled to supply a digital value of the offset; and
at least one digital to analog converter coupled to the digital value of the offset and to the amplifier.

37. The integrated circuit as recited in 30 further comprising:
a decimator circuit coupled to the sample circuit, an output of the decimator circuit coupled as a count control signal for the counter circuit.

38. The integrated circuit as recited in claim 37 wherein the decimator circuit comprises:
a one-to-transition converter;
a divide by n circuit coupled to the one-to-transition converter;
a transition-to-one converter coupled to receive an output of the divide by n circuit and coupled to supply an output of the transition-to-one converter as the count control signal.

39. The integrated circuit as recited in claim 37 further comprising a multiple clock phase generator circuit coupled to supply to the sample circuit and the decimator circuit one of a plurality of phases of a clock.

40. The integrated circuit as recited in claim 30 wherein the signal strength threshold level is programmable.

41. The integrated circuit as recited in claim 30 wherein the signal strength threshold level is programmable via a serial communications port on the integrated circuit.

42. An apparatus detecting a loss-of-signal (LOS) condition comprising:
means for determining for a plurality of data bits of an input data stream whether a signal strength magnitude of each of the data bits is above or below a signal threshold level; and
means for determining that the loss-of-signal condition exists if a predetermined number of the data bits have a signal strength magnitude below the signal threshold level.

43. An apparatus comprising:
means for sampling an input data stream;
means for comparing signal strength magnitude of the sampled input data stream to a threshold signal strength level; and
means for asserting a loss-of-signal indication if a number of samples having signal strength less than the threshold signal strength level is less than a predetermined value.

* * * * *